(12) United States Patent
Matsukawa et al.

(10) Patent No.: US 12,213,384 B2
(45) Date of Patent: Jan. 28, 2025

(54) OSCILLATOR

(71) Applicant: SEIKO EPSON CORPORATION, Tokyo (JP)

(72) Inventors: Norihito Matsukawa, Shimosuwa-machi (JP); Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 771 days.

(21) Appl. No.: 17/387,163

(22) Filed: Jul. 28, 2021

(65) Prior Publication Data

US 2022/0037579 A1 Feb. 3, 2022

(30) Foreign Application Priority Data

Jul. 30, 2020 (JP) ................. 2020-129647

(51) Int. Cl.
*H01L 41/053* (2006.01)
*H03B 5/32* (2006.01)
*H10N 30/80* (2023.01)
*H10N 30/88* (2023.01)

(52) U.S. Cl.
CPC ............. *H10N 30/88* (2023.02); *H03B 5/32* (2013.01); *H10N 30/802* (2023.02)

(58) Field of Classification Search
CPC ..................................................... H10N 30/88
USPC ......................................................... 310/348
See application file for complete search history.

(56) References Cited

U.S. PATENT DOCUMENTS

| | | |
|---|---|---|
| 6,731,180 B1 | 5/2004 | Clark et al. |
| 2014/0292422 A1 | 10/2014 | Kondo |
| 2017/0117902 A1* | 4/2017 | Isohata ............... H03H 9/0552 |
| 2017/0373693 A1 | 12/2017 | Kondo |
| 2019/0267940 A1* | 8/2019 | Obata ........................ H03L 1/04 |
| 2019/0379325 A1* | 12/2019 | Kondo ................ H10N 30/883 |
| 2020/0021294 A1 | 1/2020 | Hamaguchi et al. |
| 2020/0076438 A1 | 3/2020 | Hsieh et al. |

FOREIGN PATENT DOCUMENTS

| | | |
|---|---|---|
| JP | 2014-197730 A | 10/2014 |
| JP | 2015-2392 A | 1/2015 |
| JP | 2017-130861 | 7/2017 |
| JP | 2018-6808 A | 1/2018 |
| JP | 2020-14055 A | 1/2020 |

* cited by examiner

*Primary Examiner* — Derek J Rosenau
(74) *Attorney, Agent, or Firm* — Rankin, Hill & Clark LLP

(57) ABSTRACT

An oscillator includes: an outer package having an accommodation space; an inner package accommodated in the accommodation space and fixed to the outer package via a heat insulating member; a vibration element accommodated in the inner package; a heat generation element accommodated in the accommodation space and fixed to the inner package; an oscillation circuit configured to oscillate the vibration element; a control circuit disposed outside the accommodation space and configured to control the heat generation element; and a conductive wire electrically coupling the outer package and the inner package.

10 Claims, 9 Drawing Sheets

OSCILLATOR

The present application is based on, and claims priority from JP Application Serial Number 2020-129647, filed Jul. 30, 2020, the disclosure of which is hereby incorporated by reference herein in its entirety.

BACKGROUND

1. Technical Field

The present disclosure relates to an oscillator.

2. Related Art

JP-A-2017-130861 discloses a crystal oscillator in which a package body on which a heater IC and a vibration element are mounted is fixed in an outer package constituted by a base substrate and a cover case. In the crystal oscillator, the package body is fixed to the base substrate via a plurality of spacers.

However, in the crystal oscillator in JP-A-2017-130861, in order to establish electrical coupling between the package body and the base substrate, metal wiring or metal-plated through holes are formed in the spacers. Therefore, heat is easily transferred between the base substrate and the package body via a metal portion formed in the spacer. Therefore, heat from the outside may be easily transferred to the vibration element mounted on the package body via the spacer, and characteristics of an oscillation signal maybe easily affected by an ambient temperature. Since the heat generated by the heater IC escapes from the package body to the outside, there is also a problem that the vibration element cannot be efficiently heated.

SUMMARY

An oscillator according to the present disclosure includes: an outer package having an accommodation space; an inner package accommodated in the accommodation space and fixed to the outer package via a heat insulating member; a vibration element accommodated in the inner package; a heat generation element accommodated in the accommodation space and fixed to the inner package; an oscillation circuit configured to oscillate the vibration element; a control circuit disposed outside the accommodation space and configured to control the heat generation element; and a conductive wire electrically coupling the outer package and the inner package.

DESCRIPTION OF EXEMPLARY EMBODIMENTS

Hereinafter, preferred embodiments of an oscillator according to the present disclosure will be described in detail with reference to the accompanying drawings.

First Embodiment

Figure 1:
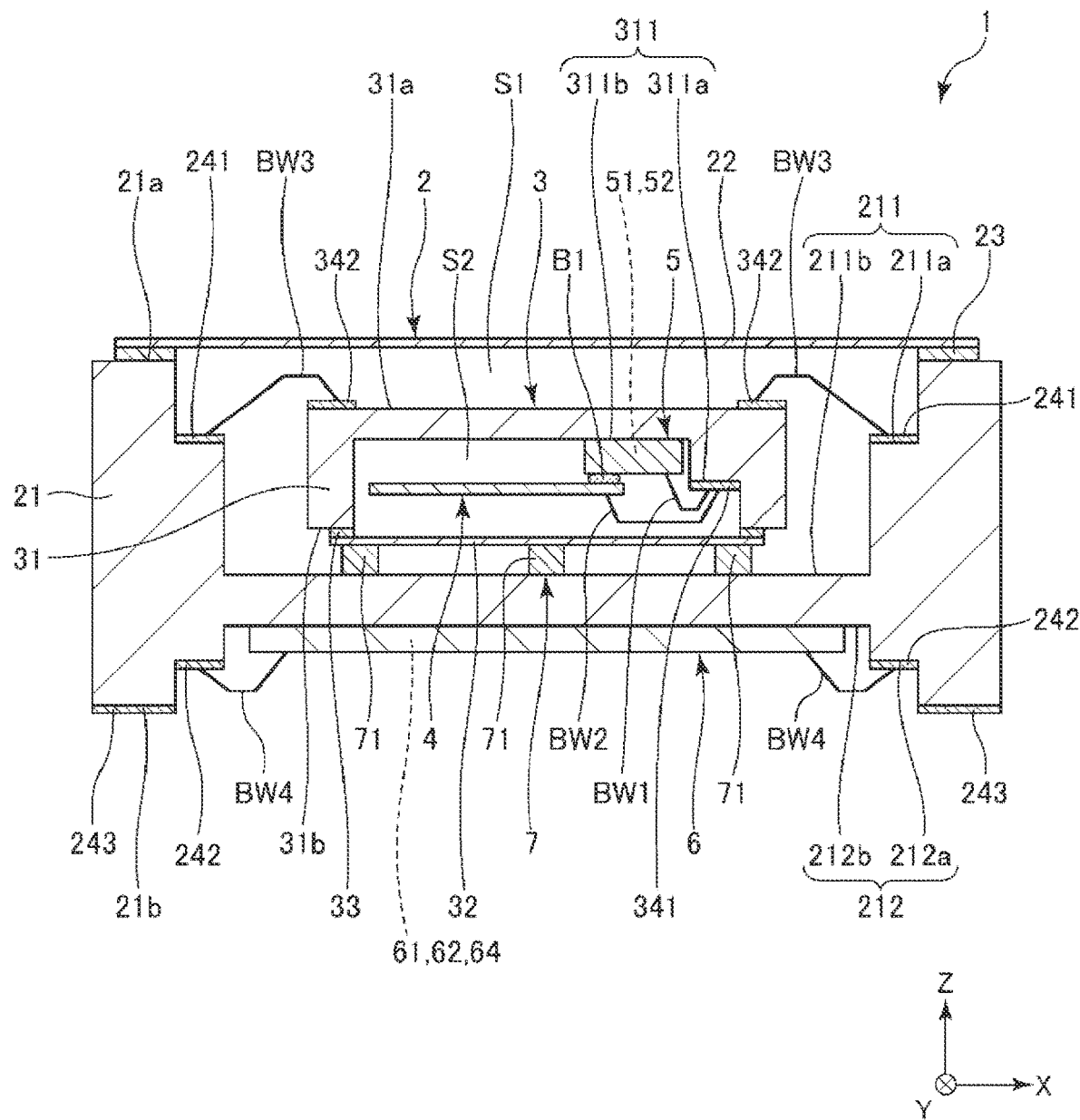
FIG. 1 is a cross-sectional view showing an oscillator according to a first embodiment.
Figure 2:
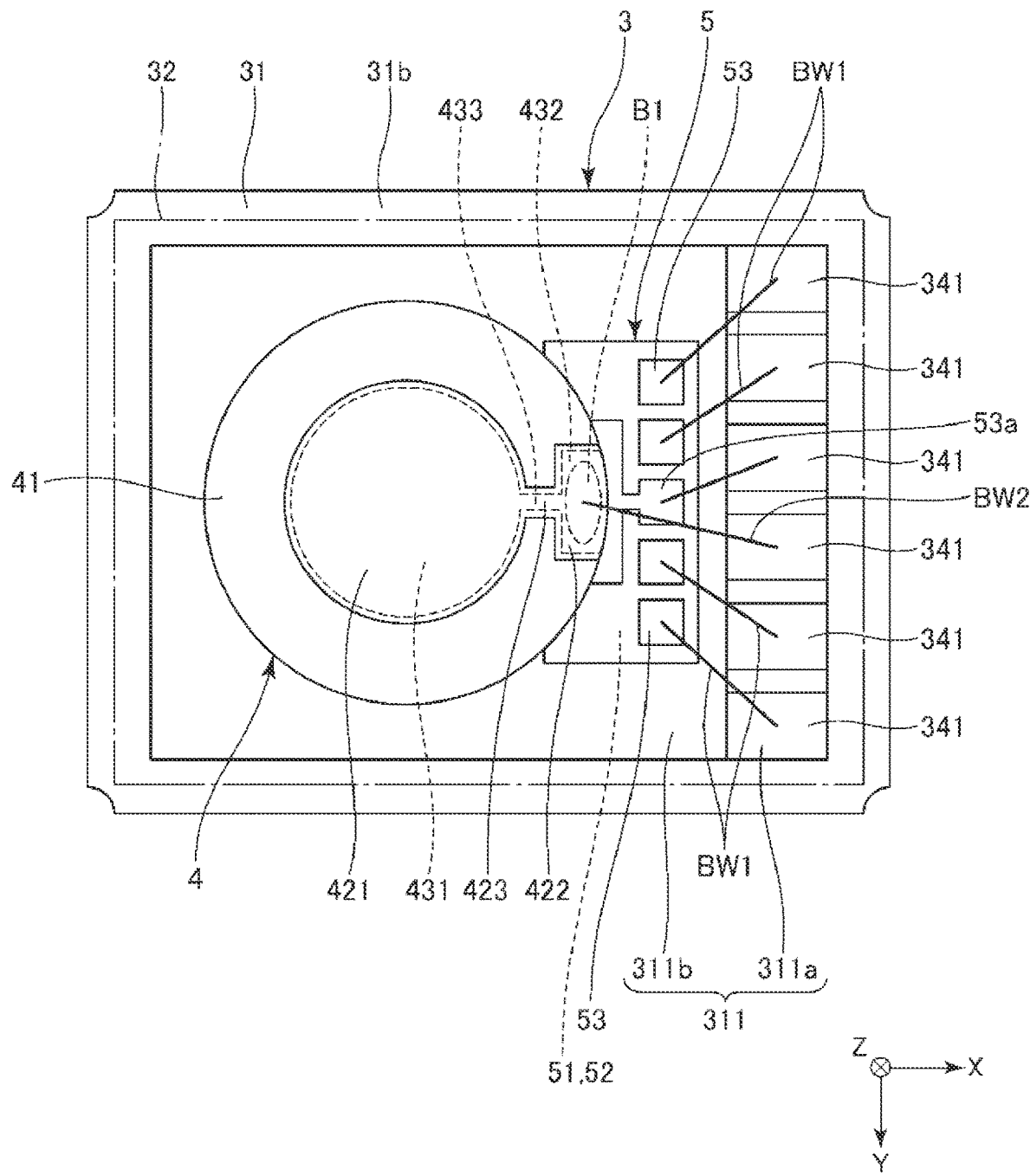
FIG. 2 is a plan view showing the inside of an inner package included in the oscillator in FIG. 1.

FIG. 1 is a cross-sectional view showing an oscillator according to a first embodiment. FIG. 2 is a plan view showing the inside of an inner package included in the oscillator in FIG. 1. For convenience of description, an X-axis, a Y-axis, and a Z-axis orthogonal to one another are illustrated in the drawings. A direction along the X-axis is also referred to as an X-axis direction, a direction along the Y-axis is also referred to as a Y-axis direction, and a direction along the Z-axis is also referred to as a Z-axis direction. An arrow side in the Z-axis direction is also referred to as "upper", and an opposite side thereof is also referred to as "lower". Further, a plan view from the Z-axis direction is also simply referred to as a "plan view".

An oscillator 1 shown in FIG. 1 is a thermostatic oven type crystal oscillator (OCXO). The oscillator 1 includes an outer package 2, an inner package 3 accommodated in the outer package 2, a vibration element 4 and a heat generation element 5 accommodated in the inner package 3, a circuit element 6 fixed to the outer package 2, a heat insulating member 7 interposed between the outer package 2 and the inner package 3, and a bonding wire BW3 which is a conductive wire electrically coupling the outer package 2 and the inner package 3. In such an oscillator 1, the vibration element 4 is heated by heat of the heat generation element 5, and the vibration element 4 is maintained at a desired temperature. Therefore, frequency variation of an oscillation signal is prevented, and excellent oscillation characteristics are implemented.

The outer package 2 includes a first base substrate 21. The first base substrate 21 has an upper surface 21a and a lower surface 21b that are in a front and back relationship. The first base substrate 21 includes a bottomed recess 211 which is a first recess that opens to the upper surface 21a, and a bottomed recess 212 which is a third recess that opens to the lower surface 21b. Therefore, the first base substrate 21 has an H-shaped cross section. The recess 211 includes a plurality of recesses, and includes a recess 211a that opens to the upper surface 21a and a recess 211b that opens to the bottom surface of the recess 211a and has an opening smaller than that of the recess 211a. The recess 212 includes a plurality of recesses, and includes a recess 212a that is open to the lower surface 21b and a recess 212b that is open to the bottom surface of the recess 212a and has an opening smaller than that of the recess 212a. The inner package 3 is fixed to the bottom surface of the recess 211b via a heat insulating member 7. The circuit element 6 is fixed to the bottom surface of the recess 212b.

A plurality of internal terminals 241 are disposed on the bottom surface of the recess 211a. A plurality of internal terminals 242 are disposed on the bottom surface of the recess 212a. A plurality of mounting terminals 243 are disposed on the lower surface 21b. The terminals 241, 242, and 243 are electrically coupled to one another via an internal wiring, which is not shown, formed in the first base substrate 21. As will be described later, each internal terminal 241 is electrically coupled to an external terminal 342 of the inner package 3 via the bonding wire BW3. Each internal terminal 242 is electrically coupled to the circuit element 6 via a bonding wire BW4. The oscillator 1 is electrically coupled to an external device, which is not shown, via the plurality of mounting terminals 243.

The outer package 2 includes a first lid 22. The first lid 22 is bonded to the upper surface 21a of the first base substrate 21 via a bonding member 23, and closes an opening of the recess 211. By closing the opening of the recess 211 with the first lid 22 in this manner, an airtight first accommodation space S1 is formed inside the outer package 2. The inner package 3 is accommodated in the first accommodation space S1.

The first accommodation space S1 is in a depressurized state, preferably in a state closer to vacuum. Accordingly, the excellent heat insulating property can be exhibited. The external heat of the oscillator 1 is less likely to be transferred to the inner package 3. Therefore, the vibration element 4 is less likely to be affected by the external heat. The vibration element 4 is easily maintained at the desired temperature by the heat of the heat generation element 5. An atmosphere of the first accommodation space S1 is not particularly limited, and may be, for example, an atmosphere in which an inert gas such as nitrogen, argon, or helium is sealed, or may be an atmospheric pressure state or a pressurized state instead of the depressurized state. As in embodiments to be described later, the first accommodation space S1 may be filled with the heat insulating member 7.

Although not particularly limited, the first base substrate 21 can be made of ceramics such as alumina. The first lid 22 can be made of a metal material such as Kovar.

The inner package 3 includes a second base substrate 31. The second base substrate 31 has an upper surface 31a and a lower surface 31b that are in the front and back relationship. The second base substrate 31 has a bottomed recess 311 which is a second recess that opens to the lower surface 31b. The recess 311 includes a plurality of recesses, and includes a recess 311a that opens to the lower surface 31b and a recess 311b that opens to the bottom surface of the recess 311a and has an opening smaller than that of the recess 311a. The heat generation element 5 is fixed to the bottom surface of the recess 311b. The vibration element 4 is fixed to the lower surface of the heat generation element 5.

A plurality of internal terminals 341 are disposed on the bottom surface of the recess 311a. A plurality of external terminals 342 are disposed on the upper surface 31a. The terminals 341 and 342 are electrically coupled to one another via an internal wiring, which is not shown, formed in the second base substrate 31.

Each of the plurality of external terminals 342 is electrically coupled to the internal terminal 241 of the first base substrate 21 via the bonding wire BW3. In this way, by providing the external terminals 342 facing the outside of the inner package 3, the electrical coupling between the inner package 3 and the outer package 2 becomes easy.

Since the conductive member electrically coupling the inner package 3 and the outer package 2 has high thermal conductivity, the conductive member easily functions as a heat transfer path between the inner package 3 and the outer package 2. Therefore, by using the thin and long linear bonding wire BW3 as the conductive member, heat transfer between the inner package 3 and the outer package 2 can be effectively prevented. Therefore, external heat of the oscillator 1 is less likely to be transferred to the inner package 3.

Therefore, the vibration element 4 is less likely to be affected by the external heat. The vibration element 4 is easily maintained at the desired temperature by the heat of the heat generation element 5. Conversely, the heat of the heat generation element 5 is less likely to escape to the outer package 2 via the bonding wire BW3. The heat of the heat generation element 5 can be efficiently transferred to the vibration element 4. Therefore, the heat generation element 5 can be efficiently driven, and the temperature of the vibration element 4 can be further stabilized.

The inner package 3 includes a second lid 32. The second lid 32 is bonded to the lower surface 31b of the second base substrate 31 via a bonding member 33, and closes the opening of the recess 311. In this way, by closing the opening of the recess 311 with the second lid 32, an airtight second accommodation space S2 is formed inside the inner package 3. The vibration element 4 and the heat generation element 5 are accommodated in the second accommodation space S2.

The second accommodation space S2 is in a depressurized state, preferably in a state closer to vacuum. Accordingly, a crystal impedance (CI) value of the vibration element 4 decreases, and oscillation characteristics are improved. An atmosphere of the second accommodation space S2 is not particularly limited, and may be, for example, an atmospheric pressure state or a pressurized state.

Although not particularly limited, the second base substrate 31 can be made of ceramics such as alumina. The second lid 32 can be made of a metal material such as Kovar.

The inner package 3 is disposed in a posture in which the second lid 32 faces the bottom surface side of the recess 211, and is fixed to the bottom surface of the recess 211 via the heat insulating member 7 in the second lid 32. In this way, by interposing the heat insulating member 7 between the inner package 3 and the outer package 2, the external heat, particularly the heat of the circuit element 6, is less likely to be transferred to the inner package 3 via the outer package 2. Therefore, the vibration element 4 is less likely to be affected by the external heat. The vibration element 4 is easily maintained at the desired temperature by the heat of the heat generation element 5. Conversely, the heat of the heat generation element 5 is less likely to escape to the outer package 2 via the inner package 3. The heat of the heat generation element 5 can be efficiently transferred to the vibration element 4. Therefore, the heat generation element 5 can be efficiently driven, and the temperature of the vibration element 4 can be further stabilized.

In particular, by fixing the second lid 32 to which the vibration element 4 is not fixed among the members constituting the inner package 3 to the outer package 2, it is possible to lengthen a heat transfer path from the heat insulating member 7 to the vibration element 4. Therefore, even when the external heat is transferred to the inner package 3 via the heat insulating member 7, the heat is less likely to be transferred to the vibration element 4. Therefore, the vibration element 4 is less likely to be affected by the external heat. The vibration element 4 is easily maintained at the desired temperature by the heat of the heat generation element 5. The present disclosure is not limited thereto, and the second base substrate 31 may be fixed to the first base substrate 21 via the heat insulating member 7.

The heat insulating member 7 is made of a material having the thermal conductivity lower than that of the second lid 32. The material for the heat insulating member 7 is not particularly limited, and for example, various resin materials, particularly, a porous resin material such as porous polyimide can be suitably used. In addition to the resin material, various glass materials, an inorganic porous material such as silica aerogel, and the like can be used. The thermal conductivity of the heat insulating member 7 is not particularly limited, but is preferably 1.0 W/m·K or less. Accordingly, the heat insulating member 7 having a sufficiently low thermal conductivity is obtained.

The heat insulating member 7 includes a plurality of columnar portions 71 disposed to be separated from each other. The columnar portions 71 are disposed in an island shape so as to spread over the entire region of the second lid 32. Accordingly, the inner package 3 can be fixed to the outer package 2 in a stable posture. A contact area between the heat insulating member 7 and the outer package 2 can be reduced. The external heat is less likely to be transferred to the inner package 3 via the heat insulating member 7. However, the present disclosure is not limited thereto, and the heat insulating member 7 may be disposed to be spread over the entire lower surface of the second lid 32. Accordingly, a bonding area between the inner package 3 and the outer package 2 is increased, and a bonding strength is increased. Therefore, a mechanical strength of the oscillator 1 is increased.

When the heat insulating member 7 has an adhesive force, the second lid 32 and the first base substrate 21 may be bonded to each other via the heat insulating member 7. On the other hand, when the heat insulating member 7 does not have the adhesive force, the heat insulating member 7 and the second lid 32 may be bonded to each other, and the heat insulating member 7 and the first base substrate 21 may be bonded to each other via a bonding member such as an adhesive. The heat insulating member 7 may include a gap material having a sufficiently low thermal conductivity, such as silica gel. Accordingly, a thickness of the heat insulating member 7 can be controlled, and heat insulating effect can be more reliably exhibited.

The vibration element 4 is an SC-cut crystal vibration element. Accordingly, the vibration element 4 having excellent frequency stability is obtained. As shown in FIG. 2, the vibration element 4 includes a disk-shaped crystal substrate 41 that is cut out by the above described SC cutting, and electrodes provided on a surface of the crystal substrate 41. The electrodes include a first excitation electrode 421 that is disposed at a central portion of a lower surface of the crystal substrate 41, and a second excitation electrode 431 that is disposed at a central portion of an upper surface of the crystal substrate 41 so as to face the first excitation electrode 421. The electrodes include a first coupling electrode 422 that is disposed at an outer edge portion of the lower surface, a first extraction electrode 423 that couples the first excitation electrode 421 and the first coupling electrode 422, a second coupling electrode 432 that is disposed at an outer edge portion of the upper surface, and a second extraction electrode 433 that couples the second excitation electrode 431 and the second coupling electrode 432.

The configuration of the vibration element 4 is not limited thereto. For example, a plan-view shape of the crystal substrate 41 is not limited to a circular shape, and may be, for example, a rectangular shape. The vibration element 4 may be an AT-cut crystal vibration element, a BT-cut crystal vibration element, a tuning-fork type crystal vibration element, an elastic surface wave resonator, another piezoelectric vibration element, a micro electro mechanical systems (MEMS) resonance element, or the like.

The vibration element 4 is disposed in a posture in which the upper surface thereof faces the heat generation element 5 side. An outer edge portion of the vibration element 4 is fixed to a lower surface of the heat generation element 5 via a conductive bonding member B1. The bonding member B1 is not particularly limited as long as the bonding member has conductivity. For example, a metal bump, a solder, a metal paste, a conductive resin adhesive, or the like can be used.

The heat generation element 5 is accommodated in the inner package 3 together with the vibration element 4. Accordingly, the heat generation element 5 can be disposed in the vicinity of the vibration element 4. The heat of the heat generation element 5 can be efficiently transferred to the vibration element 4.

Such a heat generation element 5 includes a heat generation circuit 51 that has a function as a heat generation portion that heats the vibration element 4, and a temperature sensor 52. The lower surface of the heat generation element 5 is a fixed surface for fixing the vibration element 4. As shown in FIG. 2, a plurality of electrode pads 53 are provided on the lower surface of the heat generation element 5. Each electrode pad 53 is electrically coupled to the internal terminal 341 via a bonding wire BW1.

An electrode pad 53a included in the plurality of electrode pads 53 is not electrically coupled to the heat generation circuit 51, and functions as a relay electrode that electrically couples the internal terminals 341 and the vibration element 4. The electrode pad 53a is electrically coupled to the second coupling electrode 432 of the vibration element 4 via the conductive bonding member B1. On the other hand, the first coupling electrode 422 of the vibration element 4 is electrically coupled to the internal terminals 341 via the bonding wire BW2 without via the electrode pad 53. A method of electrically coupling the vibration element 4 and the internal terminal 341 is not particularly limited.

As shown in FIG. 1, the circuit element 6 is disposed in the recess 212 of the first base substrate 21, and is fixed to the bottom surface of the recess 212. That is, the circuit element 6 is located outside the first accommodation space S1. Accordingly, the heat of the circuit element 6 is less likely to be transferred to the inner package 3. Therefore, the vibration element 4 is less likely to be affected by the heat of the circuit element 6. The vibration element 4 is easily maintained at the desired temperature by the heat of the heat generation element 5. Since the inner package 3 and the circuit element 6 can be disposed to overlap each other in the Z-axis direction, the expansion of the oscillator 1 in the X-axis direction and the Y-axis direction can be prevented, and the oscillator 1 can be miniaturized.

The circuit element 6 is electrically coupled to the internal terminals 242 of the first base substrate 21 via the bonding wire BW4. Accordingly, the circuit element 6 is electrically coupled to the vibration element 4 and the heat generation element 5.

The circuit element 6 includes a temperature sensor 61, an oscillation circuit 62, and a temperature control circuit 64. The oscillation circuit 62 has a function of oscillating the vibration element 4 and generating a temperature-compensated oscillation signal based on the temperature detected by the temperature sensor 61. That is, the oscillation circuit 62 includes an oscillation circuit unit that is electrically coupled to the vibration element 4, amplifies an output signal of the vibration element 4, and feeds back the amplified signal to the vibration element 4 to oscillate the vibration element 4, and a temperature compensation circuit unit that performs temperature compensation based on temperature information output from the temperature sensor 61 so that frequency variation of the oscillation signal is smaller than the frequency temperature characteristic of the vibration element 4 itself.

The temperature control circuit 64 is a control circuit that controls the heat generation element 5. Specifically, the temperature control circuit 64 is a circuit for controlling an amount of current flowing through a resistor of the heat generation circuit 51 based on the output signal of the temperature sensor 52 to keep the vibration element 4 at a constant temperature. For example, when a current temperature determined from the output signal of the temperature sensor 52 is lower than a set reference temperature, the temperature control circuit 64 performs control such that a desired current flows through the resistor of the heat generation circuit 51. When the current temperature is higher than the reference temperature, the temperature control circuit 64 performs control such that the current does not flow through the resistor of the heat generation circuit 51. Further, for example, the temperature control circuit 64 may perform control to increase or decrease the amount of current flowing through the resistor of the heat generation circuit in accordance with a difference between the current temperature and the reference temperature.

The oscillator 1 is described above. As described above, the oscillator 1 includes the outer package 2 that has the first accommodation space S1 which is an accommodation space, the inner package 3 that is accommodated in the first accommodation space S1 and that is fixed to the outer package 2 via the heat insulating member 7, the vibration element 4 accommodated in the inner package 3, the heat generation element 5 that is accommodated in the first accommodation space S1 and that is fixed to the inner package 3, the oscillation circuit 62 that oscillates the vibration element 4, the temperature control circuit 64 that is disposed outside the first accommodation space S1 and that is a control circuit that controls the heat generation element 5, and the bonding wire BW3, which is a conductive wire, that electrically couples the outer package 2 and the inner package 3.

In this way, by interposing the heat insulating member 7 between the inner package 3 and the outer package 2, the external heat is less likely to be transferred to the inner package 3 via the outer package 2. Therefore, the vibration element 4 is less likely to be affected by the external heat. The vibration element 4 is easily maintained at the desired temperature by the heat of the heat generation element 5. Conversely, the heat of the heat generation element 5 is less likely to escape to the outer package 2 via the inner package 3. The heat of the heat generation element 5 can be efficiently transferred to the vibration element 4. Therefore, the heat generation element 5 can be efficiently driven, and the temperature of the vibration element 4 can be further stabilized. Since the conductive member electrically coupling the inner package 3 and the outer package 2 has high thermal conductivity, the conductive member easily functions as a heat transfer path between the inner package 3 and the outer package 2. In this regard, since thin and long linear bonding wire BW3 is used as the conductive member, heat transfer between the inner package 3 and the outer package 2 can be effectively prevented. Therefore, external heat of the oscillator 1 is less likely to be transferred to the inner package 3. Therefore, also in this respect, the vibration element 4 is less likely to be affected by the external heat. The vibration element 4 is easily maintained at the desired temperature by the heat of the heat generation element 5. Therefore, the oscillator 1 has a high frequency characteristic and is capable of power saving driving.

Further, as described above, the outer package 2 includes the first base substrate 21 that includes the recess 211 which is the first recess that accommodates the inner package 3, and the first lid 22 bonded to the first base substrate 21 so as to close the opening of the recess 211. The first accommodation space S1 is formed by the recess 211 and the first lid 22. The inner package 3 is fixed to the first base substrate 21 via the heat insulating member 7. According to such a configuration, the configuration of the outer package 2 becomes simple.

As described above, the inner package 3 includes the second base substrate 31 that includes the recess 311 which is the second recessed portion that accommodates the vibration element 4, and the second lid 32 bonded to the second base substrate 31 so as to close the opening of the recess 311. The vibration element 4 is fixed to the second base substrate 31. The second lid 32 is fixed to the outer package 2 via the heat insulating member 7. In this way, by fixing the second lid 32 to which the vibration element 4 is not fixed to the outer package 2, it is possible to lengthen the heat transfer path from the heat insulating member 7 to the vibration element 4. Therefore, heat transferred from the outer package 2 to the inner package 3 via the heat insulating member 7 is less likely to be transferred to the vibration element 4. Therefore, the vibration element 4 is less likely to be affected by the external heat. The vibration element 4 is easily maintained at the desired temperature by the heat of the heat generation element 5.

As described above, the inner package 3 includes the external terminals 342 disposed on the upper surface 31a which is a surface opposite to the lower surface 31b which is a surface to which the second lid 32 of the second base substrate 31 is bonded. The external terminal 342 and the outer package 2 are electrically coupled to each other via the bonding wire BW3. Accordingly, the electrical coupling between the inner package 3 and the outer package 2 becomes easy.

As described above, the oscillator 1 includes the temperature sensor 52. Accordingly, it is easy to maintain the vibration element 4 at the desired temperature.

As described above, the first accommodation space S1 is in the depressurized state. Accordingly, the excellent heat insulating property can be exhibited. The external heat of the oscillator 1 is less likely to be transferred to the inner package 3. Therefore, the vibration element 4 is less likely to be affected by the external heat. The vibration element 4 is easily maintained at the desired temperature by the heat of the heat generation element 5.

As described above, the heat generation element 5 is accommodated in the inner package 3. Accordingly, the heat generation element 5 can be disposed in the vicinity of the vibration element 4. The heat of the heat generation element 5 can be efficiently transferred to the vibration element 4. Therefore, it is possible to efficiently drive the heat generation element 5.

The configuration of the oscillator 1 is not particularly limited. For example, a circuit component different from the circuit element 6 may be disposed in the recess 212 of the first base substrate 21. Although the circuit component is not particularly limited, for example, when a PLL circuit (phase synchronization circuit) is formed in the circuit element 6, the circuit component can be used as an oscillator for use in the PLL circuit. The recess 212 may be filled with a filler to mold the circuit element 6.

Second Embodiment

Figure 3:
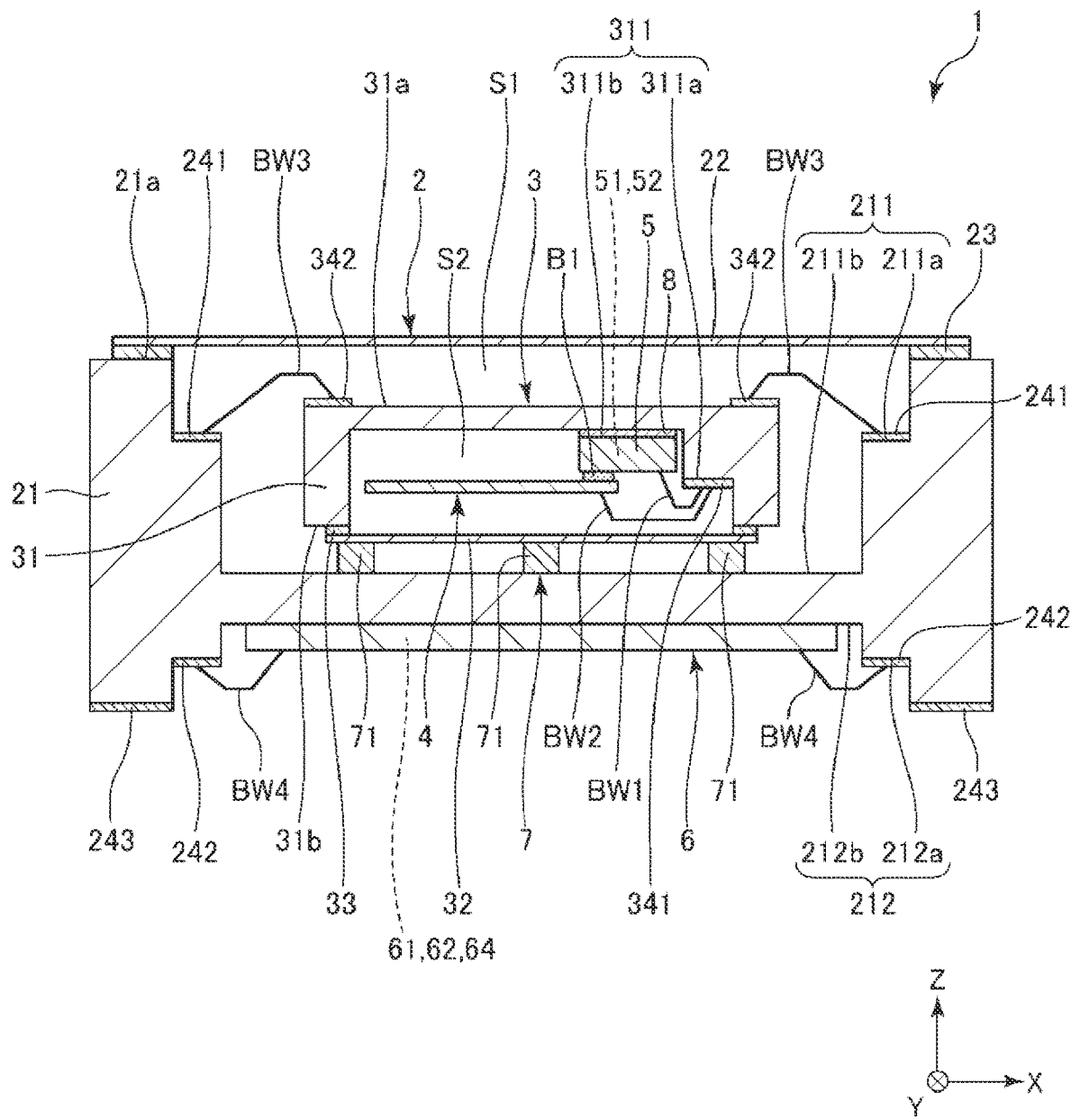
FIG. 3 is a cross-sectional view showing an oscillator according to a second embodiment.

FIG. 3 is a cross-sectional view showing an oscillator according to a second embodiment.

The present embodiment is the same as the first embodiment except that a heat insulating member 8 is also interposed between the heat generation element 5 and the inner package 3. In the following description, the present embodiment will be described with a focus on the difference from the above-described embodiments, and a description of similar matters will be omitted. In FIG. 3, the same components as those of the above described embodiment are denoted by the same reference numerals.

As shown in FIG. 3, in the oscillator 1 according to the present embodiment, the heat generation element 5 is fixed to a bottom surface of the recess 311b via the heat insulating member 8. Accordingly, heat of the heat generation element 5 is less likely to escape to the second base substrate 31. The heat of the heat generation element 5 can be efficiently transferred to the vibration element 4. Therefore, the heat generation element 5 can be efficiently driven, and the temperature of the vibration element 4 can be further stabilized. The heat insulating member 8 is made of a material having a thermal conductivity lower than that of the second base substrate 31. The heat insulating member 8 is not particularly limited, and may be made of, for example, the same material as that of the heat insulating member 7 described above.

Even in such second embodiment as described above, same effects as in the above described first embodiment can be obtained.

Third Embodiment

Figure 4:
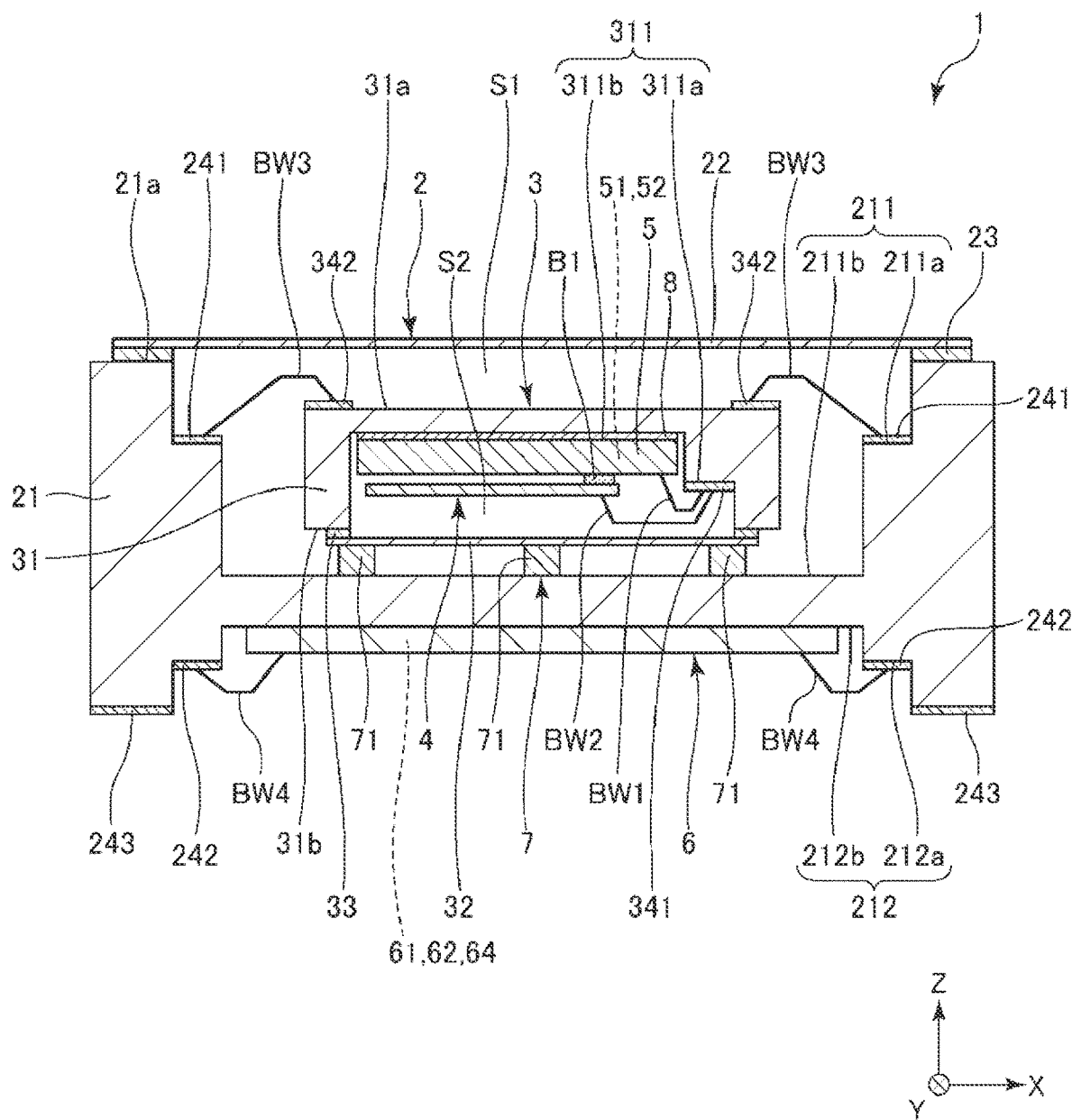
FIG. 4 is a cross-sectional view showing an oscillator according to a third embodiment.

FIG. 4 is a cross-sectional view showing an oscillator according to a third embodiment.

The present embodiment is the same as the second embodiment described above except that a size of the heat generation element 5 is different. In the following description, the present embodiment will be described focusing on differences from the above described embodiment, and description of the same matters will be omitted. In FIG. 4, the same components as those of the above described embodiment are denoted by the same reference numerals.

As shown in FIG. 4, in the oscillator 1 according to the present embodiment, the heat generation element 5 is formed to be larger than the vibration element 4 in a plan view, and is disposed so as to overlap an entire region of the vibration element 4. Accordingly, more heat can be generated from the heat generation element 5, and the heat can be more efficiently transferred to the entire region of the vibration element 4 and without unevenness. Therefore, it is possible to further stabilize the temperature of the vibration element 4.

Even in such third embodiment as described above, the same effects as in the above described first embodiment can be obtained.

Fourth Embodiment

Figure 5:
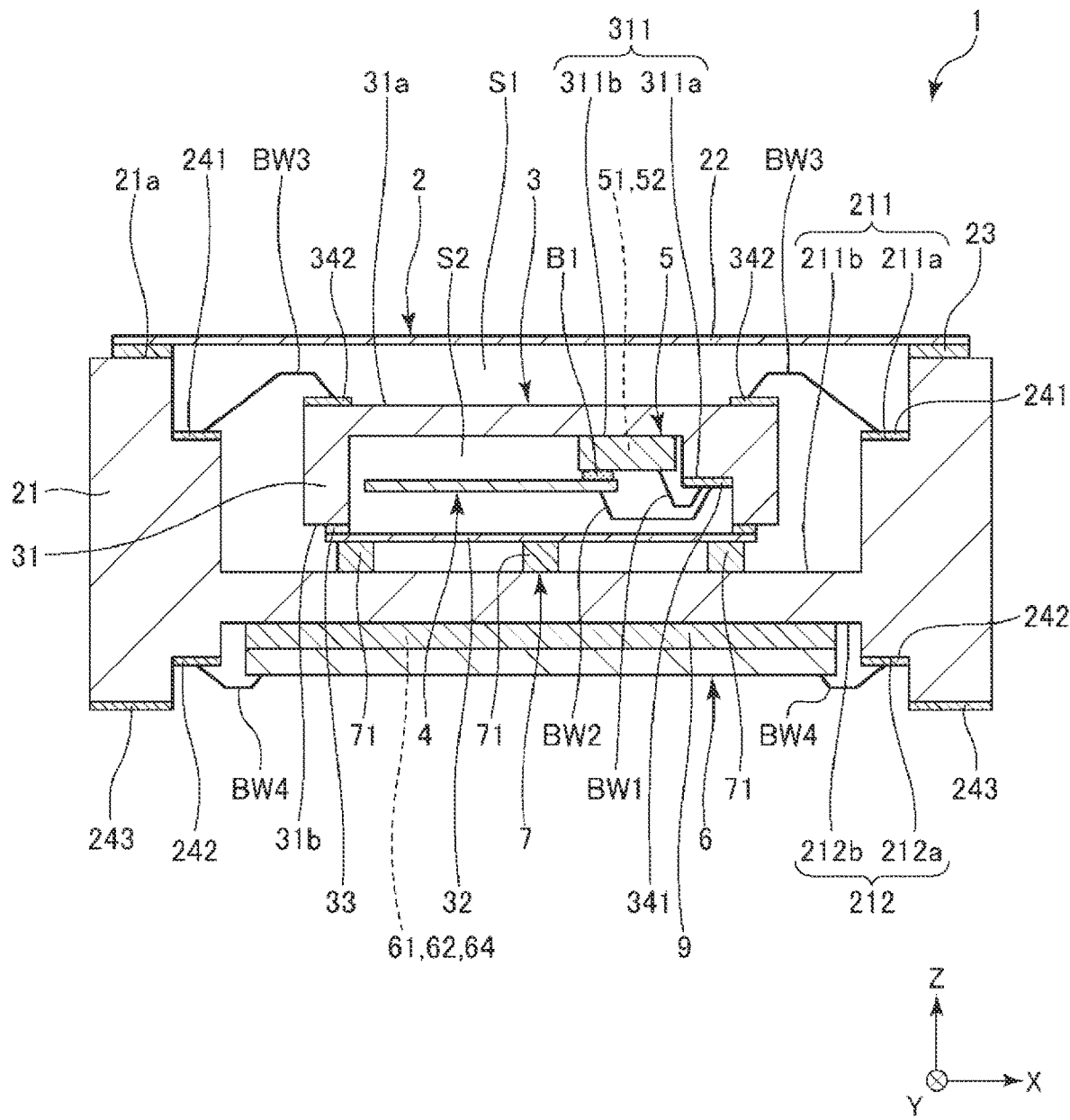
FIG. 5 is a cross-sectional view showing an oscillator according to a fourth embodiment.

FIG. 5 is a cross-sectional view showing an oscillator according to a fourth embodiment.

The present embodiment is the same as the first embodiment except that a heat insulating member 9 is interposed between the circuit element 6 and the outer package 2. In the following description, the present embodiment will be described focusing on differences from the above described embodiment, and description of the same matters will be omitted. In FIG. 5, the same components as those of the above described embodiment are denoted by the same reference numerals.

As shown in FIG. 5, in the oscillator 1 according to the present embodiment, the circuit element 6 is fixed to a bottom surface of the recess 212b via the heat insulating member 9. Accordingly, heat of the circuit element 6 is less likely to be transferred to the first base substrate 21. Therefore, the vibration element 4 is less likely to be affected by the external heat, particularly the heat of the circuit element 6. The vibration element 4 is easily maintained at a desired temperature by the heat of the heat generation element 5. The heat insulating member 9 is made of a material having a thermal conductivity lower than that of the first base substrate 21. The heat insulating member 9 is not particularly limited, and may be made of, for example, the same material as that of the heat insulating member 7 described above.

Even in such fourth embodiment as described above, the same effects as in the above described first embodiment can be obtained.

Fifth Embodiment

Figure 6:
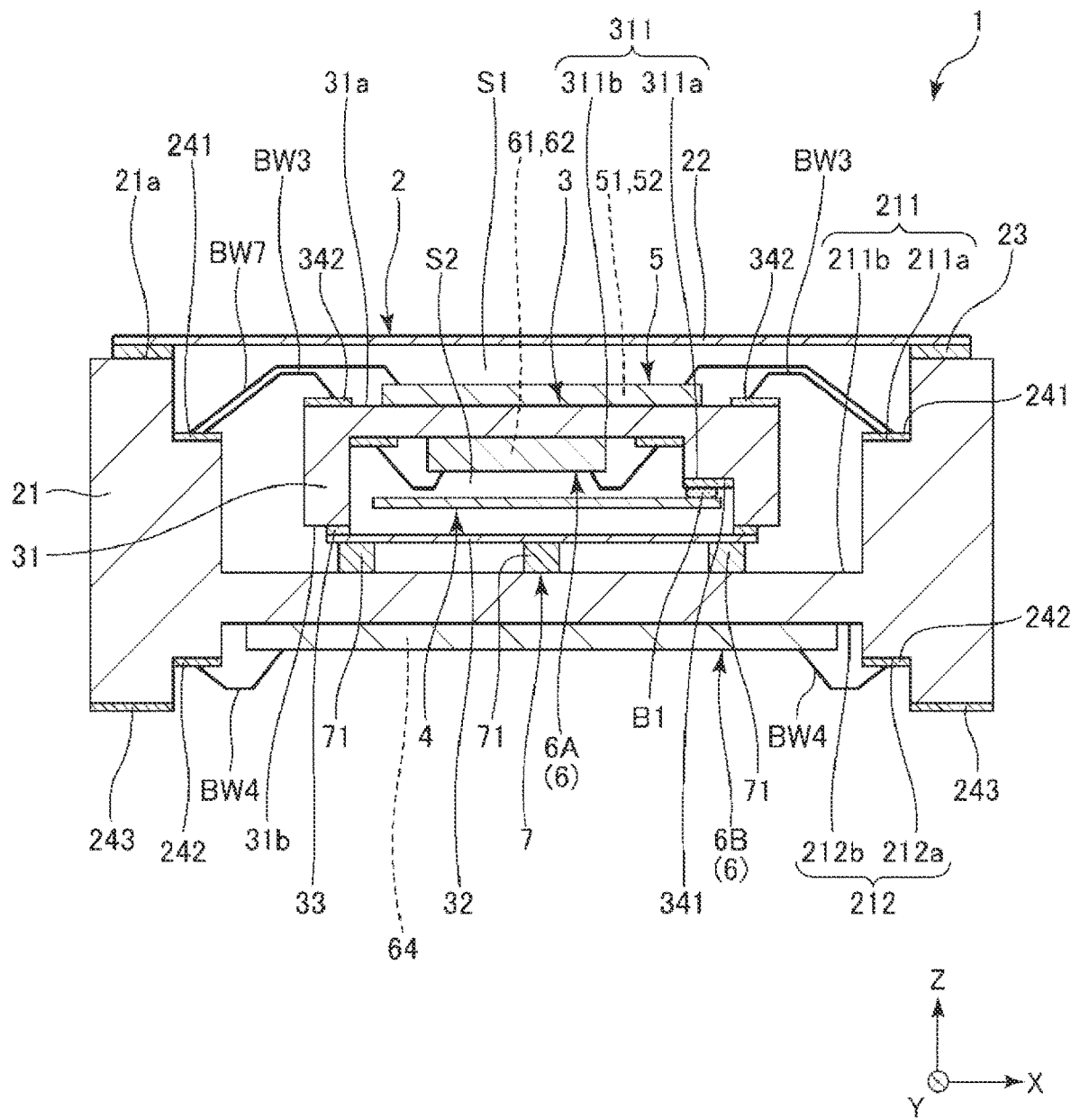
FIG. 6 is a cross-sectional view showing an oscillator according to a fifth embodiment.

FIG. 6 is a cross-sectional view showing an oscillator according to a fifth embodiment.

The present embodiment is the same as the first embodiment except that the heat generation element 5 is located outside the inner package 3 and the oscillation circuit 62 and the temperature sensor 61 in the circuit element 6 are accommodated in the inner package 3. In the following description, the present embodiment will be described focusing on differences from the above described embodiment, and description of the same matters will be omitted. In FIG. 6, the same components as those of the above described embodiment are denoted by the same reference numerals.

As shown in FIG. 6, the heat generation element 5 is located outside the inner package 3 and is accommodated in a first accommodation space S1. The heat generation element 5 is fixed to the upper surface 31a of the second base substrate 31. Therefore, heat of the heat generation element 5 is transferred to the vibration element 4 via the second base substrate 31. The heat generation element 5 is electrically coupled to the internal terminal 241 via a bonding wire BW7. In this way, by disposing the heat generation element 5 on an outer peripheral surface of the inner package 3, the number of components accommodated in the inner package 3 can be reduced. Therefore, the size of the inner package 3 can be reduced, and contamination and variation of the second accommodation space S2 due to outgas or the like can be prevented.

In the oscillator 1 according to the present embodiment, the circuit element 6 is divided into a first circuit element 6A that includes the temperature sensor 61 and the oscillation circuit 62, and a second circuit element 6B that includes the temperature control circuit 64. The second circuit element 6B is fixed to a bottom surface of the recess 212. On the other hand, the first circuit element 6A is accommodated in the inner package 3 together with the vibration element 4. In this way, by accommodating the first circuit element 6A in the inner package 3, it is possible to shorten a wiring length coupling the oscillation circuit 62 and the vibration element 4, and it is possible to generate an oscillation signal with high accuracy in which noise is less likely to be mixed from the wiring. Since the temperature sensor 61 can be disposed in the vicinity of the vibration element 4, the temperature of the vibration element 4 can be more accurately detected by the temperature sensor 61.

As described above, in the oscillator 1 according to the present embodiment, the oscillation circuit 62 is accommodated in the inner package 3. Accordingly, it is possible to shorten the wiring length coupling the oscillation circuit 62 and the vibration element 4, and it is possible to generate the oscillation signal with high accuracy in which the noise is less likely to be mixed from the wiring.

As described above, the heat generation element 5 is disposed on the upper surface 31a which is a surface opposite to the lower surface 31b which is a surface to which the second lid 32 of the second base substrate 31 is bonded. In this way, by disposing the heat generation element 5 on an outer peripheral surface of the inner package 3, the number of components accommodated in the inner package 3 can be reduced. Therefore, the size of the inner package 3 can be reduced, and contamination and variation of the second accommodation space S2 due to outgas or the like can be prevented. In particular, by disposing the heat generation element 5 on the upper surface 31a, the heat transfer path to the vibration element 4 can be sufficiently shortened. The heat of the heat generation element 5 can be efficiently transferred to the vibration element 4.

Even in such fifth embodiment as described above, the same effects as in the above described first embodiment can be obtained.

Sixth Embodiment

Figure 7:
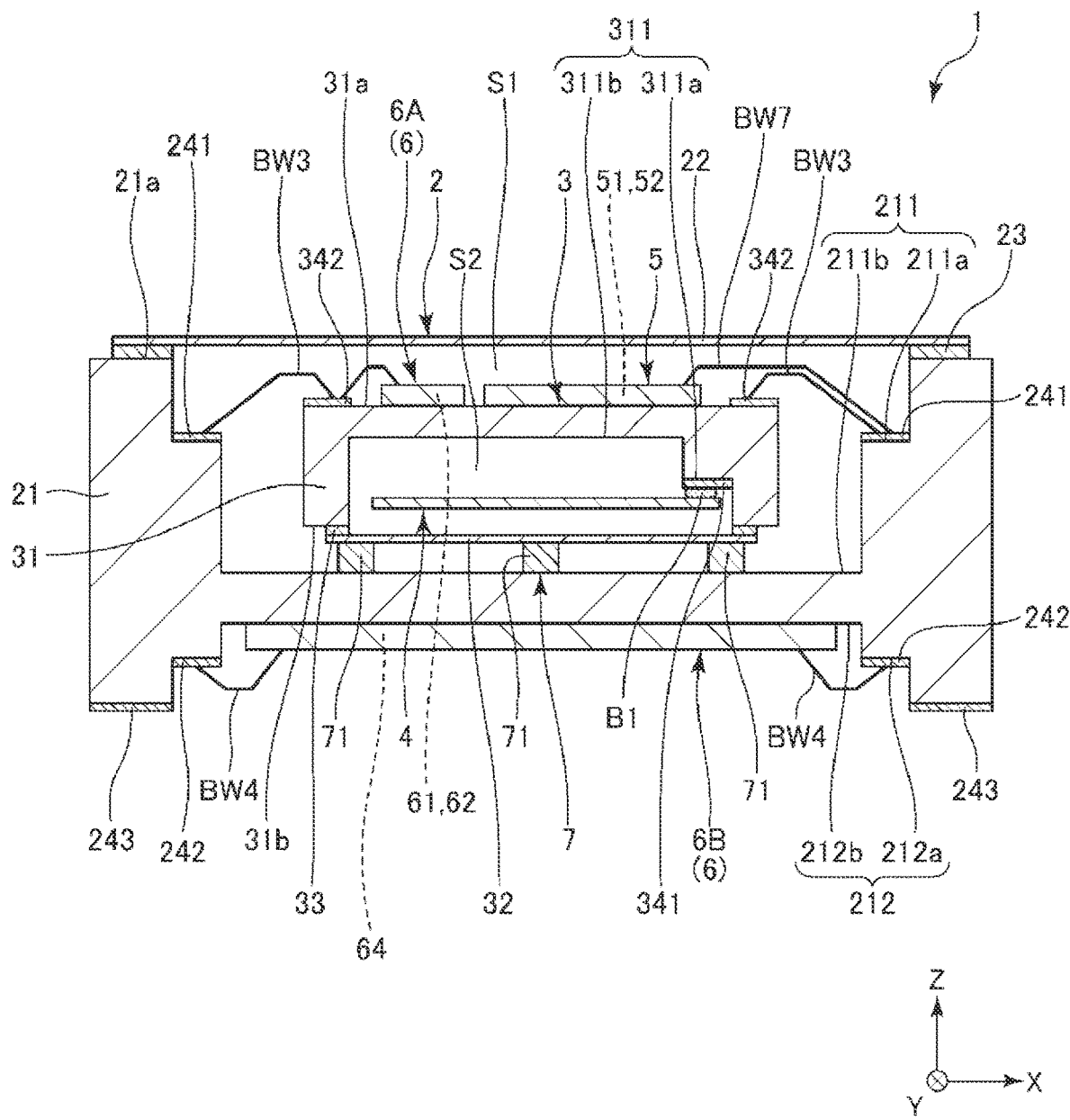
FIG. 7 is a cross-sectional view showing an oscillator according to a sixth embodiment.

FIG. 7 is a cross-sectional view showing an oscillator according to a sixth embodiment.

The present embodiment is the same as the fifth embodiment described above except that the first circuit element 6A is located outside the inner package 3. In the following description, the present embodiment will be described focusing on differences from the above described embodiment, and description of the same matters will be omitted. In FIG. 7, the same components as those of the above described embodiment are denoted by the same reference numerals.

As shown in FIG. 7, in the oscillator 1 according to the present embodiment, the first circuit element 6A including the oscillation circuit 62 is located outside the inner package 3 and is accommodated in a first accommodation space S1. The first circuit element 6A is fixed to the upper surface 31a of the second base substrate 31 together with the heat generation element 5. The first circuit element 6A is electrically coupled to the vibration element 4 and the external terminal 342 via an internal wiring, which is not shown, formed in the second base substrate 31. In this way, by disposing the first circuit element 6A outside the inner package 3, the number of components accommodated in the inner package 3 can be reduced. Therefore, the size of the inner package 3 can be reduced, and contamination and variation of the second accommodation space S2 due to outgas or the like can be prevented.

Even in such sixth embodiment as described above, the same effects as in the above described first embodiment can be obtained.

Seventh Embodiment

Figure 8:
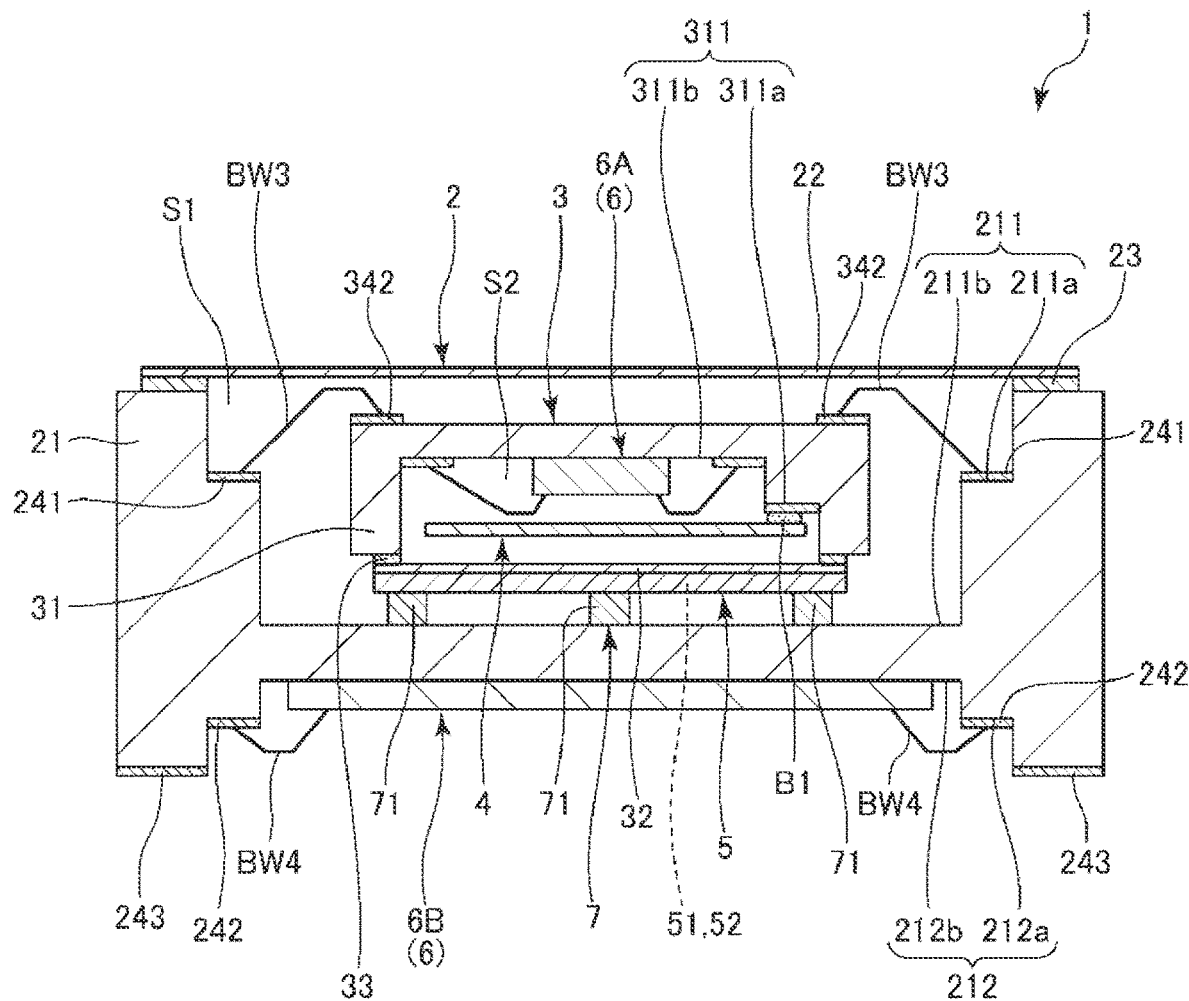
FIG. 8 is a cross-sectional view showing an oscillator according to a seventh embodiment.
Figure 8:
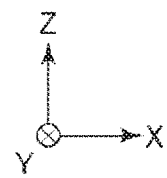

FIG. 8 is a cross-sectional view showing an oscillator according to a seventh embodiment.

The present embodiment is the same as the fifth embodiment described above except that the arrangement of the heat generation element 5 is different. In the following description, the present embodiment will be described focusing on differences from the above described embodiment, and description of the same matters will be omitted. In FIG. 8, the same components as those of the above described embodiment are denoted by the same reference numerals.

As shown in FIG. 8, in the oscillator 1 according to the present embodiment, the heat generation element 5 is disposed between the second lid 32 and the heat insulating member 7. Accordingly, heat transferred from the outside to the inner package 3 via the heat insulating member 7 is absorbed by the heat generation element 5 and is used as a part of the heat of the heat generation element 5. Therefore, a temperature change of the vibration element 4 due to the heat other than the heat generation element 5 can be prevented, and the temperature of the vibration element 4 is further stabilized.

Even in such seventh embodiment as described above, the same effects as in the above described first embodiment can be obtained.

Eighth Embodiment

Figure 9:
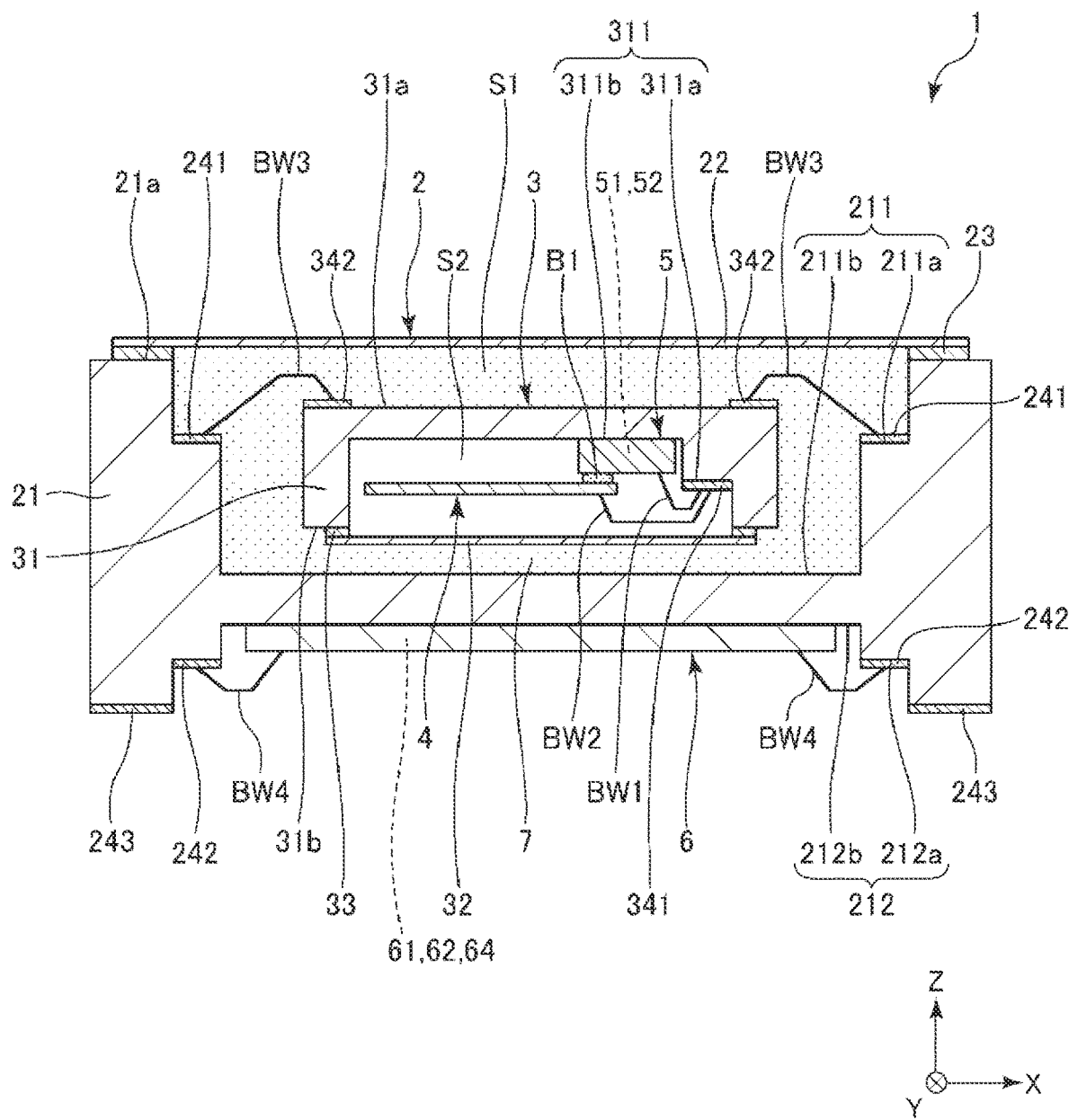
FIG. 9 is a cross-sectional view showing an oscillator according to an eighth embodiment.

FIG. 9 is a cross-sectional view showing an oscillator according to an eighth embodiment.

The present embodiment is the same as the first embodiment described above except that the arrangement of the heat insulating member 7 is different. In the following description, the present embodiment will be described focusing on differences from the above described embodiment, and description of the same matters will be omitted. In FIG. 9, the same components as those of the above described embodiment are denoted by the same reference numerals.

As shown in FIG. 9, in the oscillator 1 according to the present embodiment, the heat insulating member 7 is filled in a first accommodation space S1. That is, the heat insulating member 7 is disposed substantially without a gap in the first accommodation space S1. An entire circumference of the inner package 3 is covered with the heat insulating member 7. Accordingly, the inner package 3 can be more firmly fixed to the outer package 2, and a mechanical strength of the oscillator 1 is increased.

Even in such eighth embodiment as described above, the same effects as in the above described first embodiment can be obtained.

As mentioned above, although the oscillator according to the disclosure is described based on illustrated embodiments, the disclosure is not limited thereto. A configuration of each part can be replaced with any configuration having a similar function. Further, any other constituents may be added to the present disclosure. Further, each of the above described embodiments may be combined as appropriate.

What is claimed is:

1. An oscillator comprising:
an outer package having an accommodation space;
the outer package includes a first recess on a top surface side and a second recess on a bottom surface side;
the first recess including a sidewall;
the second recess including a sidewall;
an inner package accommodated in the accommodation space and fixed to bottom surface side of the first recess of the outer package via a heat insulating member;
the inner package includes an inner lid;
wherein the in ner packag s disposed in a posture in which the inner lid is facing the bottom surface recess:
the heat insulating member has a lower thermal conductivity than the inner lid;
a vibration element accommodated in the inner package;
a heat generation element accommodated in the accommodation space and fixed to an outer surface of the inner package;

an oscillation circuit accommodated in the inner package and configured to oscillate the vibration element;

a control circuit disposed outside the accommodation space and configured to control the heat generation element; and a conductive wire electrically coupling the outer package and the inner package.

2. The oscillator according to claim 1, wherein the outer package includes a first base substrate that has the first recess that accommodates the inner package, and an outer lid bonded to the first base substrate so as to close an opening of the first recess, the accommodation space is formed by the first recess and the outer lid, and the inner package is fixed to the first base substrate via the heat insulating member.

3. The oscillator according to claim 1, wherein the inner package includes a second base substrate that has a recess that accommodates the vibration element, and inner lid bonded to the second base substrate so as to close an opening of the recess of the inner package, the vibration element is fixed to the second base substrate, and the inner lid is fixed to the outer package via the heat insulating member.

4. The oscillator according to claim 3, wherein the inner package includes an external terminal that is disposed on a surface of the second base substrate opposite to a surface to which the inner lid is bonded, and the external terminal and the outer package are electrically coupled to each other via the conductive wire.

5. The oscillator according to claim 1, wherein the oscillation circuit is accommodated in the inner package.

6. The oscillator according to claim 1, further comprising:

a temperature sensor.

7. The oscillator according to claim 1, wherein the accommodation space is in a depressurized state.

8. The oscillator according to claim 1, wherein the heat insulating member is filled in the accommodation space.

9. The oscillator according to claim 1, wherein the heat generation element is accommodated in the inner package.

10. The oscillator according to claim 3, wherein the heat generation element is disposed on a surface of the second base substrate opposite to a surface to which the inner lid is bonded.

* * * * *